United States Patent [19]

Wei et al.

[11] Patent Number: 5,028,819
[45] Date of Patent: Jul. 2, 1991

[54] HIGH VOLTAGE CMOS OPEN-DRAIN OUTPUT BUFFER

[75] Inventors: Tom S. Wei; Elisabeth Ekman; Andre Walker; Stephen Clark, all of Campbell, Calif.

[73] Assignee: Zilog, Inc., Campbell, Calif.

[21] Appl. No.: 535,403

[22] Filed: Jun. 8, 1990

[51] Int. Cl.$^5$ ................... H01L 29/78; H03K 19/094
[52] U.S. Cl. ............................... 307/451; 357/23.13; 361/91
[58] Field of Search ............... 307/451, 443, 475; 361/91, 101; 357/23.13

[56] References Cited

U.S. PATENT DOCUMENTS

| | | | |
|---|---|---|---|
| 4,678,950 | 7/1987 | Mitake | 357/23.13 |
| 4,707,622 | 11/1987 | Takao et al. | 307/475 |
| 4,760,433 | 7/1988 | Young et al. | 357/23.13 |
| 4,763,021 | 8/1988 | Stickel | 307/443 |
| 4,855,620 | 8/1989 | Duvvury et al. | 361/91 |

*Primary Examiner*—David Hudspeth
*Assistant Examiner*—Andrew Sanders
*Attorney, Agent, or Firm*—Majestic, Parsons, Siebert & Hsue

[57] ABSTRACT

A CMOS N-channel, open-drain, pull-down buffer circuit is capable of pulling down voltages on an external pad in excess of the breakdown voltage of the individual N-channel field effect transistors in the buffer circuit. The circuit may be fabricated as part of a CMOS interated circuit in an industrial standard 1.5 microns CMOS process. The higher voltage acceptance is effected by using two open-drain N-transistors in series such that the external voltage is divided among the two transistors. A parallel high voltage circuit to the external pad can be independently optimized to provide a lower impedance path and a higher endurance for electrostatic discharge. While the two-transistor voltage divider exposes one of the transistor' gate to ESD via another external terminal, enhanced ESD protection is effected by having a resistor in series between the gate and the external terminal.

20 Claims, 1 Drawing Sheet

HIGH VOLTAGE CMOS OPEN-DRAIN OUTPUT BUFFER

This invention relates generally to complementary metal oxide semiconductor (CMOS) circuits and more particularly, to a CMOS open-drain output buffer which will permit operation at voltages higher than the breakdown voltages of the individual semiconductor devices and at the same time offers enhanced protection against electrostatic discharge.

BACKGROUND OF THE INVENTION

CMOS integrated circuits having a very large integration of CMOS field effect transistors (FET) have the advantage of consuming little power in quiescent state. However, compared to bipolar transistors, CMOS are disadvantageous in having lower breakdown voltages (BVDSS), which is a function of device topology and manufacturing process. With an industry standard 1.5-micron CMOS process, BVDSS is typically about 10V nominal. With typical operational voltages of 0-5V, the relatively low breakdown voltages are not a problem. However, when a CMOS circuit interfaces with an external device, higher voltages which exceed the breakdown voltage of the CMOS device are often encountered. It is thus desirable to provide a CMOS circuit that can withstand higher voltages without having to modify well established fabrication processes.

Another problem in CMOS devices is its high susceptibility to electrostatic discharge (ESD). This is due to it being a very high impedance device, whereby electrostatic charges often find a lower impedance path through rupturing the device. To provide improved reliability, it is thus desirable to provide better ESD protection.

SUMMARY OF THE INVENTION

Accordingly it is an object of the present invention to provide an improved CMOS circuit that can withstand voltages higher than the breakdown voltages of the individual devices in the integrated circuit and to afford higher electrostatic discharge protection.

It is another object of the present invention to provide an improved CMOS open-drain output buffer for up to 18V applications.

These and additional objects of the invention are accomplished, briefly, by two parallel circuits, one optimized for an open-drain output buffer, and the other optimized for ESD protection of the device. The open-drain output buffer has an input for receiving an input signal and an output coupled to an external terminal. It serves to pull down an external voltage at the external terminal in response to an input signal. The ESD protection circuit is effected by a turned-off transistor having sufficiently large size to better endure ESD and to provide a lower impedance path for it. In order to withstand and pull down voltages at the external terminal higher than the breakdown voltage of the individual transistors, both circuits include an additional high-biased N-channel field effect transistor with its source and drain in series between the external terminal and the open drain of the original transistor. When the additional transistors having a threshold voltage $V_T$ are biased at a gate voltage of $V_G$, the external voltage $V_E$ will have a voltage drop of $V_E - (V_G - V_T)$ across the source and drain of the additional transistors and a voltage drop of $(V_G - V_T)$ across the source and drain of the original transistors. Thus the device can tolerate a high external voltage as long as $V_E - (V_G - V_T)$ does not exceed the source-drain breakdown voltage $BV_{DSS}$ of the individual transistors. In the preferred embodiment, $V_G$ is provided by the 5V $V_{DD}$ of CMOS circuits.

The additional transistors for handling higher external voltages also result in additional exposure of the circuit to ESD via the terminal for supplying $V_{DD}$. A resistor in series between the $V_{DD}$ terminal and the gates of the additional transistors helps to increase ESD protection.

This only briefly summarizes the major aspects of the present invention. Other objects, advantages and aspects of the present invention will become apparent from the following detailed description which should be taken in conjunction with the accompanying drawings.

DETAILED DESCRIPTION OF THE PREFERRED EMBODIMENT

Figure 1:
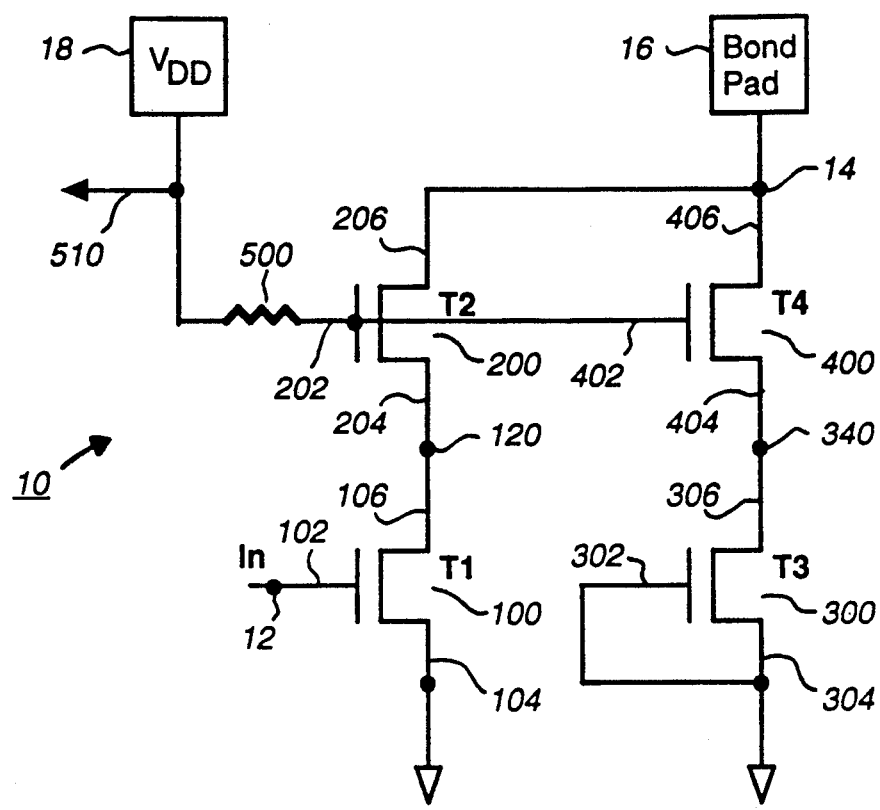
FIG. 1 illustrates a schematic circuit of the invention.

FIG. 1 is a schematic circuit diagram of the high-voltage open-drain output buffer 10. The output buffer 10 typically is one of many that forms part of an integrated circuit. The output buffer 10 has an input node 12 where an input signal controls the voltage state at an output node 14. The output node 14 is coupled to an external terminal or a bond pad 16 for connection to external circuitry. In typical applications comtemplated, the external circuitry will pull the bond pad 16 to a potential up to +12V to +18V. The output buffer 10 serves as a pull-down buffer, which, in response to an input signal at the input node 12, will pull the potential at the output node 14 and therefore the bond pad 16 down to a ground potential.

Essentially, the open-drain output buffer 10 comprises two parallel circuits The first parallel circuit provides the pull-down function, and comprises two N-channel FET transistors 100, 200 in series. The second parallel circuit provides a low impedance path for increased electro-static discharge (ESD) protection, and comprises two N-channel FET transistors 300, 400 in series. The N-channel FET transistors 100, 200, 300 and 400 are fabricated as part of an integrated circuit in an N-well CMOS process.

In the first parallel circuit which provides the pull-down function, the N-channel FET transistor 100 has a gate electrode 102, a source electrode 104, a drain electrode 106. The gate electrode 102 is coupled to the input node 12 for receiving an input signal $V_{IN}$. The source electrode 104 is connected to a ground potential. Similarly, the N-channel FET transistor 200 has a gate electrode 202, a source electrode 204, a drain electrode 206. The source electrode 204 is coupled to the drain electrode 106 of the transistor 100. The gate electrode 202 is connected to a reference voltage source with a potential of $V_{DD}$. In CMOS circuits, $V_{DD}$ is usually at 5V and is supplied from an external terminal or a bond pad 18 of the integrated circuit. The drain electrode 206 is an open drain coupled via the output node 14 to the bond pad 16.

The individual N-channel FET transistor such as 100, 200, 300, 400 typically operates with a drain-source voltage $V_{DS}$ of a maximum of 5V. In an industry standard, 1.5-micron, N-well CMOS process, it has a low breakdown voltage $BV_{DSS}$ of about 8V to 14V. However, in the applications contemplated, the open-drain output buffer 10 may be required to pull down voltages as high as 18V from external circuitry at the bond pad 16. If a single transistor such as 100 were employed as a pull-down buffer, its drain 106 would then be connected to the bond pad 16. When the transistor 100 is turned off with a LOW signal at the input 12, the full external 18V would be across the drain 106 and source 104 of the transistor 100, thereby exceeding the breakdown voltage of the transistor.

In the present invention, the extra N-channel transistor 200 in series with the input N-channel transistor 200 effectively increases the breakdown voltage of the buffer 10. The N-channel transistor 200 is constantly biased to a high voltage through its gate electrode 202. In this way, when for example transistor 100 is off with a LOW input and the node 120 is left floating, an 18V that appears at the bond pad 16 will try to pull the node 120 up to 18V. However, as soon as the voltage at the node 120 reaches $V_{G2}-V_{T2}$, where $V_{G2}$ is the gate voltage and $V_{T2}$ is the threshold voltage of the transistor 200 respectively, the transistor 200 will be turned off with no further voltage increase at the node 120. Generally, the higher the gate voltage $V_{G2}$, the higher will the final voltage at the node 120. In practice, $V_{G2}$ is provided by the highest voltage of the system, which in this case is $V_{DD}$ (5V) from the bond pad 18. With $V_{T2}$ typically about 0.5V, the highest voltage the node 120 is pulled up to by the voltage at the bond pad 16 is then about 4.5V. Thus the full external voltage from the bond pad 16 will be divided across the two transistors 100, 200 in series. A voltage of 4.5V will be across the drain and source of the transistor 100 and a voltage of 13.5V will be across the drain and source of the transistor 200 In either transistors 100, 200, its breakdown voltage $BV_{DSS}$ is not exceeded.

In the case when a HIGH signal is at the input 12, the transistor 100 is turned on, and the voltage at the bond pad 16 is pulled down to the ground potential as required of a pull-down buffer.

As mentioned earlier, CMOS devices are highly susceptible to electrostatic discharge (ESD). Electrostatic charges usually enter the integrated circuit through its external terminals. In the circuit of FIG. 1, the external terminals will be the bond pad 16 and the bond pad 18 through which $V_{DD}$ is supplied. The present invention minimizes the effect of high electrostatic voltages that may appear at these terminals.

In the case of ESD protection through the bond pad 16, a second circuit comprising the transistors 300 and 400 in series provides a lower impedance path for electrostatic discharge relative to the path given by the transistor 100, 200. Essentially, the lower impedance is effected by the relatively larger size of the transistors 300, 400. By using two separate parallel circuits, the functions of the open-drain buffer and the ESD protection can be optimized independently. Thus, transistors 300, 400 have sizes optimized for protection against ESD, while transistors 100, 200 in the first circuit can have their sizes optimized for drive requirement and other considerations for implementing an optimal open-drain buffer.

In the ESD protection circuit, the N-channel transistor 300 has a gate electrode 302 and a source electrode 304, both connected to the ground potential. Thus the transistor 300 is always off. Normally, in low-voltage circuits, the drain electrode 306 would be connected to the bond pad 16. However, in high-voltage applications as described above, an 18V appearing at the bond pad 16 may exceed the drain-source breakdown voltage $BV_{DSS}$ of the transistor 300. To overcome this problem as in the buffer circuit, the HIGH-biased transistor 400 is inserted in series between the bond pad 16 and the transistor 300. Thus, the transistor 400 has a gate electrode 402 connected to the gate electrode of the transistor 200 to be biased at $V_{DD}$. It has a source electrode 404 connected to the drain electrode 306 of the transistor 300, and a drain electrode 406 coupled to the bond pad 16. In this way, similar to the buffer circuit with transistors 100, 200, the full external voltage at the bond pad 16 is divided among the two transistors 300, 400 so that their $BV_{DSS}$ will not be exceeded. The sizes of transistors 300, 400 are optimized for increased endurance to ESD while providing a relatively lower impedance path for the leaking of the charge.

In the case of ESD protection through the bond pad 18 which is connected to a $V_{DD}$ voltage supply, the main consideration is protection against a high electrostatic voltage across the bond pad 18 and the bond pad 16 which can result in rupture of the gate of transistors 200 and 400. The introduction of the transistors 200 and 400 helps to increase the effective breakdown voltage of the buffer 10, but it also exposes the buffer to an additional bond pad 18. This problem does not arise in low-voltage applications where only the transistor 100 will suffice as an open-drain buffer since there will be no connection to the bond pad 18. However, in the present invention, the transistor 200 is biased with $V_{DD}$ and has its gate 202 exposed to the bond pad 18.

The present invention calls for the insertion of a resistor 500 between the bond pad 18 and the gate of the transistors 200 and 400. The resistor 500 will drastically reduce the current flow resulting from the electrostatic discharge along the path from the bond pad 18 to the bond pad 16. Since the bond pad 18 also connects $V_{DD}$ via a line 510 to other parts of the integrated circuit, the electrostatic charge accumulated on the bond pad 18 tends to leak away thereto. In the preferred embodiment, the resistor 500 is fabricated as poly-silicon. It has been found that the introduction of the resistor 500 with a value of 2000 to 10000 ohms helps to reduce the rejection rate of the fabricated device from 5% to almost 0%.

Figure 2:
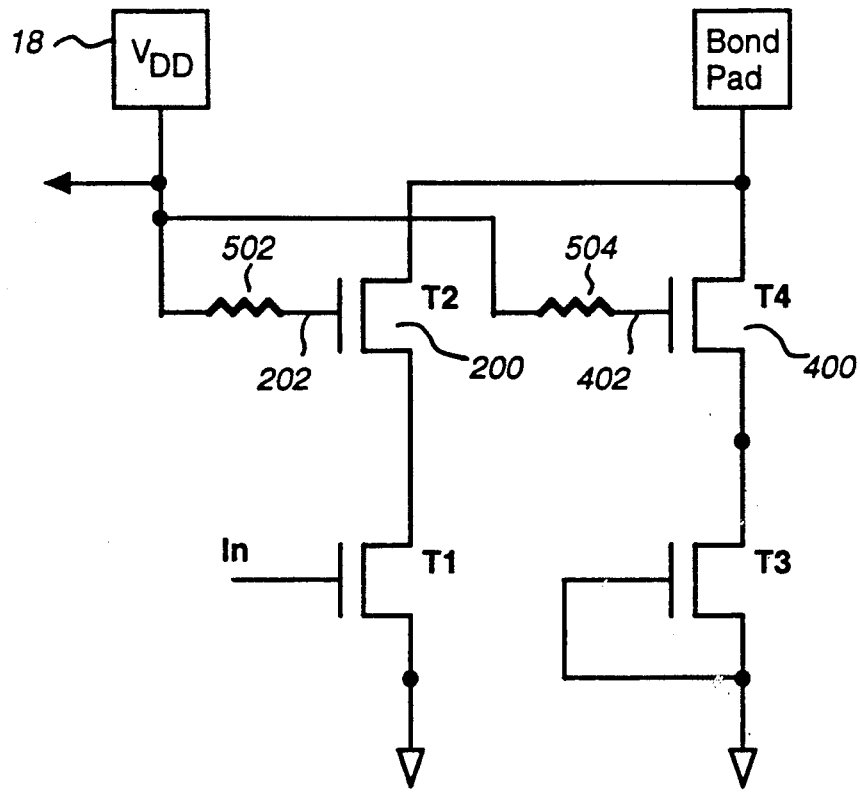
FIG. 2 illustrates an alternative embodiment of the invention.

FIG. 2 illustrates an alternative embodiment in which each gate of the additional transistors has its own resistor in-line to the bond pad 18. Thus, a resistor 502 is inserted between the bond pad 18 and the gate electrode 202 of the transistor 200. Similarly, a resistor 504 is inserted between the bond pad 18 and the gate electrode 402 of the transistor 400.

The various aspects of the present invention cooperate to provide a CMOS N-channel, open-drain output buffer which is capable of pulling down a voltage in excess of the breakdown voltage of the individual transistors in the circuit while offering enhanced protection against ESD. The above description of method and construction used is merely illustrative thereof, and various changes of the details and the methods and construction may be made within the scope of the appended claims.

It is claimed:

1. A high-voltage CMOS open-drain buffer, comprising:

a first N-channel field effect transistor having a gate for receiving an input signal, a source electrode maintained at a first voltage, and a drain electrode;

a second N-channel field effect transistor having a source electrode for coupling to the drain electrode of the first transistor, a gate electrode, a resistor in series between the gate electrode and a first external terminal for connecting to a second voltage, and a drain electrode for connecting to a second external terminal;

a third N-channel field effect transistor having a gate electrode maintained at said first voltage, a source electrode maintained at said first voltage, and a drain electrode; and a fourth N-channel field effect transistor having a source electrode for coupling to the drain electrode of the third transistor, a gate electrode coupled to the gate electrode of the second transistor, and a drain electrode for connecting to the second external terminal.

2. A high-voltage CMOS open-drain buffer as in claim 1, wherein said second voltage is higher than said first voltage.

3. A high-voltage CMOS open-drain buffer as in claim 2, wherein said second voltage is at five volts relative to said first voltage.

4. A high-voltage CMOS open-drain buffer as in claim 1, wherein the first and second N-channel field effect transistors have sizes optimized for drive capabilities of the open-drain buffer, and the third and fourth N-channel field effect transistors have sizes optimized for providing a lower impedance path for electro-static discharge from said second external terminal through the fourth and third N-channel field effect transistors.

5. A high-voltage CMOS open-drain buffer as in claim 4, wherein the third and fourth N-channel field effect transistors have sizes larger than that of the first and second N-channel field effect transistors, thereby providing a lower impedance path for electrostatic discharge from said second external terminal through the third and fourth N-channel field effect transistors, said lower impedance path being provided independent of the controlling of the output-drive capabilities.

6. A high-voltage CMOS open-drain buffer, comprising:

a first N-channel field effect transistor having a gate for receiving an input signal, a source electrode maintained at a first voltage, and a drain electrode;

a second N-channel field effect transistor having a source electrode for coupling to the drain electrode of the first transistor, a gate electrode, a resistor in series between the gate electrode and a first external terminal for connecting to a second voltage, and a drain electrode for connecting to a second external terminal;

a third N-channel field effect transistor having a gate electrode maintained at said first voltage, a source electrode maintained at said first voltage, and a drain electrode; and a fourth N-channel field effect transistor having a source electrode for coupling to a the drain electrode of the third transistor, a gate electrode, a resistor in series between the gate electrode and a first external terminal for connecting to a second voltage, and a drain electrode for connecting to a second external terminal.

7. A high-voltage CMOS open-drain buffer as in claim 6, wherein said second voltage is higher than said first voltage.

8. A high-voltage CMOS open-drain buffer as in claim 7, wherein said second voltage is at five volts relative to said first voltage.

9. A high-voltage CMOS open-drain buffer as in claim 6, wherein the first and second N-channel field effect transistors have sizes optimized for drive capabilities of the open-drain buffer, and the third and fourth N-channel field effect transistors have sizes optimized for providing a lower impedance path for electro-static discharge from said second external terminal through the fourth and third N-channel field effect transistors.

10. A high-voltage CMOS open-drain buffer as in claim 9, wherein the third and fourth N-channel field effect transistors have sizes larger than that of the first and second N-channel field effect transistors, thereby providing a lower impedance path for electrostatic discharge from said second external terminal through the third and fourth N-channel field effect transistors, said lower impedance path being provided independent of the controlling of the output-drive capabilities.

11. A high-voltage CMOS open-drain buffer, comprising:

a first N-channel field effect transistor having a gate for receiving an input signal, a source electrode maintained at a first voltage, and a drain electrode;

a second N-channel field effect transistor having a source coupled to the drain of the first transistor, a gate electrode, a resistor in series between the gate electrode and a first external terminal for connecting to a second voltage, and a drain electrode for connecting to a second external terminal, said first and second N-channel transistors having respectively a first and second breakdown voltage associated therewith, such that a voltage exceeding either first or second breakdown voltage may be applied at the second external terminal without the first and second field effect transistors exceeding their first and second breakdown voltages respectively;

a third N-channel field effect transistor having a gate electrode maintained at said first voltage, a source electrode maintained at said first voltage, and a drain electrode; and a fourth N-channel field effect transistor having a source coupled to the drain of the third transistor, a gate electrode coupled to the gate electrode of the second transistor, and a drain electrode for connecting to a second external terminal, said third and fourth N-channel field transistors having respectively a third and fourth breakdown voltage associated therewith, such that a voltage exceeding either third or fourth breakdown voltage may be applied at the second external terminal without the third and fourth field effect transistors exceeding their third and fourth breakdown voltages respectively.

12. A high-voltage CMOS open-drain buffer as in claim 11, wherein said second voltage is higher than said first voltage.

13. A high-voltage CMOS open-drain buffer as in claim 12, wherein said second voltage is at five volts relative to said first voltage.

14. A high-voltage CMOS open-drain buffer as in claim 11, wherein the first and second N-channel field effect transistors have sizes optimized for drive capabilities of the open-drain buffer, and the third and fourth N-channel field effect transistors have sizes optimized for providing a lower impedance path for electro-static discharge from said second external terminal through the fourth and third N-channel field effect transistors.

15. A high-voltage CMOS open-drain buffer as in claim 14, wherein the third and fourth N-channel field effect transistors have sizes larger than that of the first and second N-channel field effect transistors, thereby providing a lower impedance path for electrostatic discharge from said second external terminal through the third and fourth N-channel field effect transistors, said lower impedance path being provided independent of the controlling of the output-drive capabilities.

16. A high-voltage CMOS open-drain buffer, comprising:
   a first N-channel field effect transistor having a gate for receiving an input signal, a source electrode maintained at a first voltage, and a drain electrode;
   a second N-channel field effect transistor having a source coupled to the drain of the first transistor, a gate electrode, a resistor in series between the gate electrode and a first external terminal for connecting to a second voltage, and a drain electrode for connecting to a second external terminal, said first and second N-channel transistors having respectively a first and second breakdown voltage associated therewith, such that a voltage exceeding either first or second breakdown voltage may be applied at the second external terminal without the first and second field effect transistors exceeding their first and second breakdown voltages respectively;
   a third N-channel field effect transistor having a gate electrode maintained at said first voltage, a source electrode maintained at said first voltage, and a drain electrode; and
   a fourth N-channel field effect transistor having a source coupled to the drain of the third transistor, a gate electrode, a resistor in series between the gate electrode and a first external terminal for connecting to a second voltage, and a drain electrode for connecting to a second external terminal, said third and fourth N-channel field effect transistors having respectively a third and fourth breakdown voltage associated therewith, such that a voltage exceeding either third or fourth breakdown voltage may be applied at the second external terminal without the third and fourth field effect transistors exceeding their third and fourth breakdown voltages respectively.

17. A high-voltage CMOS open-drain buffer as in claim 16, wherein said second voltage is higher than said first voltage.

18. A high-voltage CMOS open-drain buffer as in claim 17, wherein said second voltage is at five volts relative to said first voltage.

19. A high-voltage CMOS open-drain buffer as in claim 16, wherein the first and second N-channel field effect transistors have sizes optimized for drive capabilities of the open-drain buffer, and the third and fourth N-channel field effect transistors have sizes optimized for providing a lower impedance path for electro-static discharge from said second external terminal through the fourth and third N-channel field effect transistors.

20. A high-voltage CMOS open-drain buffer as in claim 19, wherein the third and fourth N-channel field effect transistors have sizes larger than that of the first and second N-channel field effect transistors, thereby providing a lower impedance path for electrostatic discharge from said second external terminal through the third and fourth N-channel field effect transistors, said lower impedance path being provided independent of the controlling of the output-drive capabilities.

* * * * *

UNITED STATES PATENT AND TRADEMARK OFFICE
CERTIFICATE OF CORRECTION

PATENT NO. : 5,028,819
DATED : JULY 2, 1991
INVENTOR(S) : TOM S. WEI, et al.

It is certified that error appears in the above-identified patent and that said Letters Patent is hereby corrected as shown below:

Column 5, line 63, in Claim 6:   delete "a" after "to"

Signed and Sealed this

Third Day of November, 1992

Attest:

DOUGLAS B. COMER

*Attesting Officer*   Acting Commissioner of Patents and Trademarks